(12) United States Patent
Donders (10) Patent No.: US 8,976,333 B2
(45) Date of Patent: Mar. 10, 2015

(54) LITHOGRAPHIC APPARATUS AND LITHOGRAPHIC APPARATUS COOLING METHOD

(75) Inventor: Sjoerd Nicolaas Lambertus Donders, Vught (NL)

(73) Assignee: ASML Netherlands B.V., Veldhoven (NL)

( * ) Notice: Subject to any disclaimer, the term of this patent is extended or adjusted under 35 U.S.C. 154(b) by 959 days.

(21) Appl. No.: 13/115,309

(22) Filed: May 25, 2011

(65) Prior Publication Data

US 2011/0317137 A1 Dec. 29, 2011

Related U.S. Application Data

(60) Provisional application No. 61/357,844, filed on Jun. 23, 2010.

(51) Int. Cl.
*G03F 7/20* (2006.01)
*F28F 27/00* (2006.01)

(52) U.S. Cl.
CPC ............ *G03F 7/70858* (2013.01); *F28F 27/00* (2013.01)
USPC .............................................. 355/30; 355/53

(58) Field of Classification Search
CPC ... G03F 7/70858; G03F 7/70875; F28F 27/00
USPC .......................................... 355/30, 53, 72, 75
See application file for complete search history.

(56) References Cited

U.S. PATENT DOCUMENTS

| | | |
|---|---|---|
| 7,196,768 B2 | 3/2007 | Ottens et al. |
| 2001/0055102 A1 | 12/2001 | Emoto |
| 2006/0087637 A1 | 4/2006 | Ottens et al. |
| 2009/0090498 A1* | 4/2009 | Okada .......................... 165/299 |

FOREIGN PATENT DOCUMENTS

| | | |
|---|---|---|
| CN | 1760739 | 5/2006 |
| CN | 1798953 | 7/2006 |
| JP | 2001-290543 | 10/2001 |
| JP | 2004-247462 | 9/2004 |
| JP | 2004-357426 | 12/2004 |
| JP | 2005-026288 | 1/2005 |
| KR | 10-2006-0018879 | 3/2006 |
| KR | 10-2006-0049358 | 5/2006 |
| WO | 2004/109757 | 12/2004 |

OTHER PUBLICATIONS

Chinese Office Action dated May 29, 2013 in corresponding Chinese Patent Application No. 201110165289.9.

* cited by examiner

*Primary Examiner* — Peter B Kim
(74) *Attorney, Agent, or Firm* — Pillsbury Winthrop Shaw Pittman LLP

(57) ABSTRACT

A lithographic apparatus includes an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a cooling system to cool a part of the lithographic apparatus with increased cooling capabilities to reduce the heat transfer from the part to other parts of the apparatus.

7 Claims, 4 Drawing Sheets

LITHOGRAPHIC APPARATUS AND LITHOGRAPHIC APPARATUS COOLING METHOD

CROSS REFERENCE TO RELATED APPLICATIONS

This application claims priority and benefit under 35 U.S.C. §119(e) to U.S. Provisional Patent Application No. 61/357,844, entitled "Lithographic Apparatus and Lithographic Apparatus Cooling Method", filed on Jun. 23, 2010. The content of that application is incorporated herein in its entirety by reference.

FIELD

The present invention relates to a lithographic apparatus comprising a cooling system to cool a part of the lithographic apparatus, and a method to cool a part of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Lithographic apparatus usually comprise components which act as undesired heat sources. An example of such a component is an electromagnetic actuator in which a current interacts with a magnetic field (e.g. produced by permanent magnets) to generate actuation forces. The current is carried by a conductor, i.e. a coil, which has a certain electrical resistance. Due to this resistance energy will be dissipated and heat is generated as an undesired by-product of the actuation forces.

The undesired heat may be transported, i.e. leak, to other parts of the lithographic apparatus such as optical elements or substrate tables and cause deformations there which may have an impact on overlay and position accuracy.

Therefore, the heat sources are usually cooled to remove the generated heat and thus prevent heat transport to other parts of the lithographic apparatus. However, the maximum cooling capacity may be restricted by the available space. This is especially the case for electromagnetic actuators in which the efficiency is dependent on the distance between coil and permanent magnet, and wherein the smaller the distance the more efficient the actuator is. An efficient electromagnetic actuator thus leaves little space for a cooling system. As a result, the available cooling capacity may be less than the amount of heat generated, so that an excess of heat may still leak to other parts and impact overlay and position accuracy.

SUMMARY

It is desirable to provide an improved lithographic apparatus having a cooling system to cool a part of the lithographic apparatus with increased cooling capabilities to reduce the heat transfer from the part to other parts of the apparatus, preferably without interfering the operation of the parts.

According to an embodiment of the invention, there is provided a lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate; and
a cooling system to cool a part of the lithographic apparatus, the cooling system comprising:
a cooling channel to contain coolant, the cooling channel being at least partially in thermal contact with the part, the cooling channel having an inlet and an outlet;
a coolant transporter device configured to transport coolant from the inlet through the cooling channel to the outlet; and
a heat transporter device in thermal contact with both the inlet and outlet of the cooling channel to transfer heat from the coolant present at the inlet to the coolant present at the outlet.

According to another embodiment of the invention, there is provided a lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate; and
a cooling system to cool a part of the lithographic apparatus, the cooling system comprising:
a cooling unit to contain coolant, the cooling unit being in thermal contact with at least partially a surface of the part, the cooling unit further having an inlet, an outlet and a wall adjacent the surface of the part;
a coolant transporter device configured to transport coolant from the inlet through the cooling unit to the outlet,
wherein the cooling unit is configured to direct coolant from and to the wall in a direction perpendicular to the wall at multiple locations distributed across the part.

According to yet another embodiment of the invention, there is provided a lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate; and a cooling system to cool a part of the lithographic apparatus, the cooling system comprising:

a cooling channel to contain coolant, the cooling channel being arranged at a distance from the part;

a coolant transporter device configured to transport coolant through the cooling channel;

a heat transporter device in thermal contact with the part and the cooling channel to transfer heat from the part to the coolant in the cooling channel, wherein the heat transporter device is adapted to the available space around the part.

According to a further embodiment of the invention, there is provided a method for cooling a part of a lithographic apparatus, comprising:

providing a heat transporter device in an available space around the part to make thermal contact with at least a portion of the part;

extending the heat transporter device to a distance from the part where there is more space available;

providing a cooling channel with coolant in thermal contact with the heat transporter device;

transporting the coolant through the cooling channel with a coolant transporter device such that heat can be transferred from the part to the coolant via the heat transporter device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
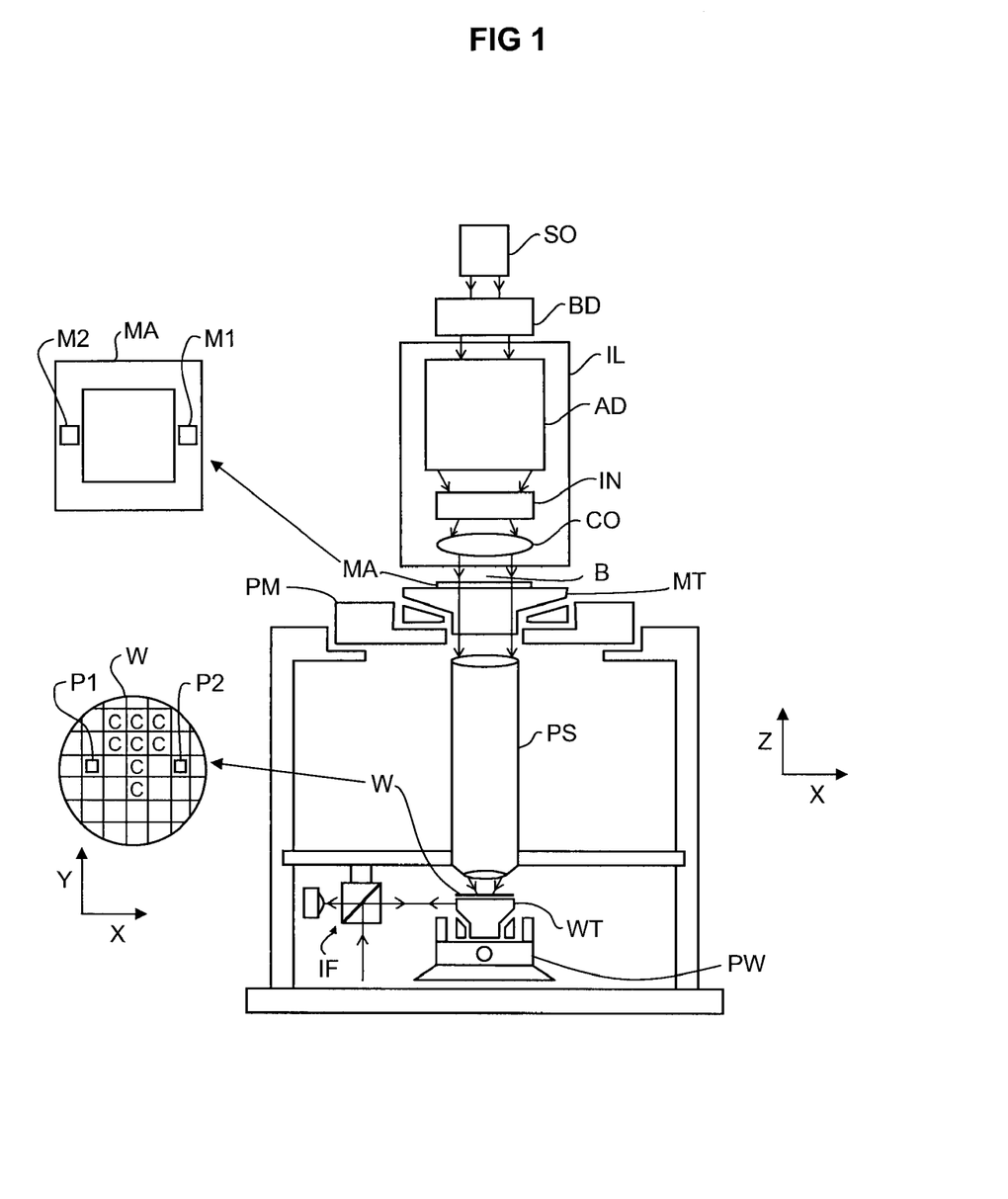
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
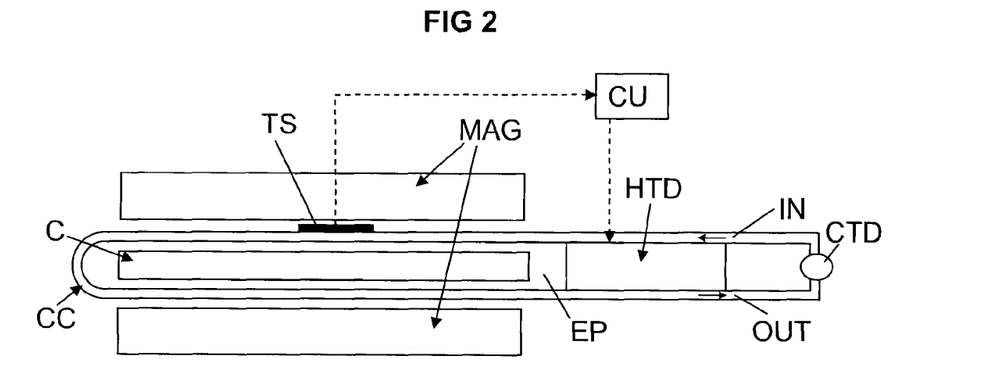
FIG. 2 depicts schematically a cooling system according to an embodiment of the invention.

FIG. 2 depicts a part of a lithographic apparatus with a cooling system according to an embodiment of the invention. In this embodiment, the part comprises a coil C which is part of a long-stroke or short-stroke module of a positioning device positioning the substrate table WT of FIG. 1 and is located between two magnet assemblies MAG. The part can alternatively be any part of the lithographic apparatus of FIG. 1, in particular an undesired heat generating part or component.

The coil C is encapsulated by an epoxy EP, e.g. a capton foil layer to electrically isolate the coil C from other parts of the lithographic apparatus. From now on if reference is made to the coil C of FIG. 2, the epoxy EP is included unless stated otherwise.

Arranged in a loop around the coil C is a cooling channel CC. In practice multiple cooling channels may be provided, but only one is shown here for simplicity reasons. The cooling channel comprises an inlet IN and an outlet OUT and is filled with coolant (not explicitly shown). The inlet IN and outlet OUT are connected to a coolant transporter device CTD (also broadly termed a patterning device) which is configured to transport the coolant from the inlet IN through the cooling channel to the outlet OUT. A heat exchanger may be provided in the cooling circuit to remove heat from the coolant, but this may be integrated in the coolant transport device. The coolant transporter device or patterning device may be controlled to provide coolant at the inlet IN with a predetermined temperature.

Between the inlet IN and the outlet OUT a heat transporter device HTD (also broadly termed a heat transporter) is provided to transport heat from the coolant present at the inlet IN to the coolant present at the outlet OUT. The heat transporter device may be a thermoelectric or thermionic heat pump to force a heat flow from the inlet IN to the outlet OUT which has a higher temperature than the inlet IN.

A benefit of this configuration is that by transporting heat from the inlet to the outlet the temperature of the coolant entering the cooling channel is adjusted. This will result in lowering of the outside surface temperature of the cooling channel as well to meet the temperature of the other parts, so that the heat transport from the coil to other parts, e.g. the magnets MAG, of the lithographic apparatus is reduced.

The temperature of the outside surface of the cooling channel is measured by a temperature sensor TS and an output of the sensor may be used to control the temperature of the coolant after passing the heat transporter device HTD by appropriately driving the heat transporter device by a control unit CU (also broadly termed a controller).

Another advantage of this arrangement of components is that the inlet IN and the outlet OUT of the cooling channel are provided on the same side of the coil (in FIG. 2 on the right side), so that the heat transporter device can be provided between the inlet and the outlet without altering the thickness of the coil C including cooling channel. The efficiency of the actuator is thus not influenced by applying the invention. It is not necessary in an embodiment of the invention that the heat transporter device is close to the heat generating part. The inlet, outlet and heat transporter device may also be provided at a distance, where there is more space. Such an embodiment also falls within the scope of the invention.

Figure 3:
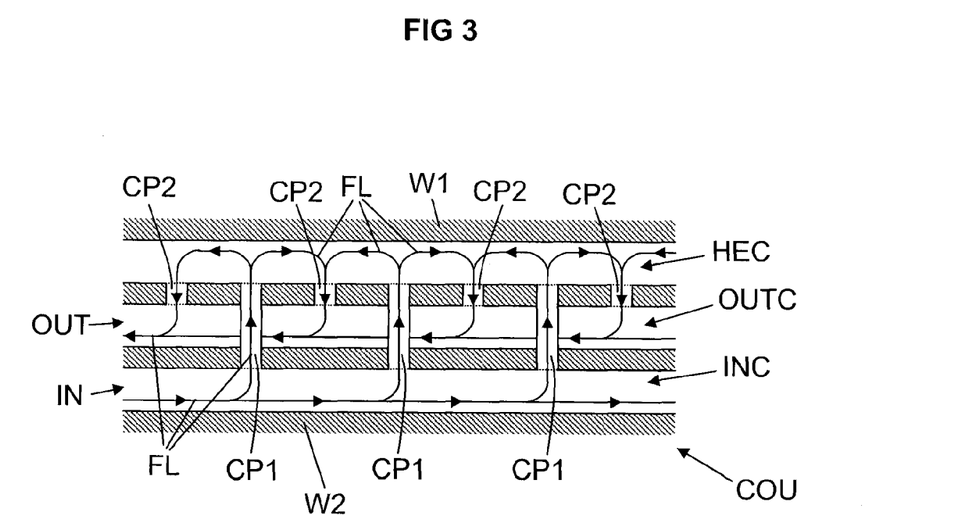
FIG. 3 depicts schematically a part of a cooling unit of a cooling system according to yet another embodiment of the invention.

FIG. 3 depicts schematically a portion of a cooling unit COU of a cooling system according to another embodiment of the invention. The cooling unit COU has an inner wall W1 adjacent a surface of a heat generating part (not shown) of a lithographic apparatus, e.g. the lithographic apparatus of FIG. 1. Across the inner wall W1 heat transfer may take place between the part and the cooling system. The cooling unit further has an outer wall W2 which may face other parts of the lithographic apparatus, for instance magnets as depicted in FIG. 2. The cooling unit COU covers preferably in an embodiment at least partially the part, i.e. the cooling unit is preferably in an embodiment in thermal contact with at least a portion of the part, more preferably in an embodiment with at least the main portion of the part.

Between the inner wall W1 and the outer wall W2, three chambers are stacked upon each other, namely an inlet chamber INC connected to an inlet IN, an outlet chamber OUTC connected to an outlet OUT, and a heat exchange chamber HEC close to the inner wall W1. The cooling unit is further provided with first cooling channels CP1 extending from the inlet chamber INC into the heat exchange chamber HEC, and second cooling channels CP2 extending from the heat exchanging chamber HEC into the outlet chamber OUTC. The cooling unit in working condition is filled with a coolant and connected to a coolant transporter device (not shown) configured to transport coolant from inlet IN to outlet OUT through the cooling unit COU. Possibly, a heat exchanger is provided in the coolant circuit to remove heat from the coolant, but this may also be integrated into the coolant transporter device. The transportation of coolant through the cooling unit is shown by the corresponding flow lines FL.

The first and second cooling channels CP1, CP2 are alternately arranged and distributed across the part so that multiple distinct flows are provided that approach and leave the inner wall W1, i.e. the heat exchange chamber HEC, in a direction substantially perpendicular to the wall. In other words, the cooling unit is configured to direct coolant from and to the wall in a direction substantially perpendicular to the wall at multiple locations distributed across the part. The density of distinct locations is preferably in an embodiment at least 1 location per square cm, more preferably in an embodiment at least 10 locations per square cm, and most preferably in an embodiment at least 50 locations per square cm.

A benefit of this embodiment is that the main direction of transportation of coolant near and in the heat exchange chamber HEC is substantially perpendicular to the wall W1, so that the resulting jets penetrate the boundary layer near the wall W1 thereby improving the heat transfer. Also a turbulent flow may be created in the heat exchange chamber HEC which has a higher heat transfer rate than a laminar flow created by a flow mainly parallel to the wall W1. As a result the cooling capacity increases and less heat will be transferred to other parts of the lithographic apparatus.

The inlet IN and outlet OUT may be interchanged, thereby reversing the transportation direction of the coolant relative to the situation shown in FIG. 3. However, the shown embodiment has the benefit that the temperature of the coolant in the inlet chamber is the lowest and forms a heat shield for the heat generating part, so that less heat is going to other parts of the lithographic apparatus. In other words, the inlet chamber is provided on the outside of the cooling unit and facing away from the part.

Figure 4:
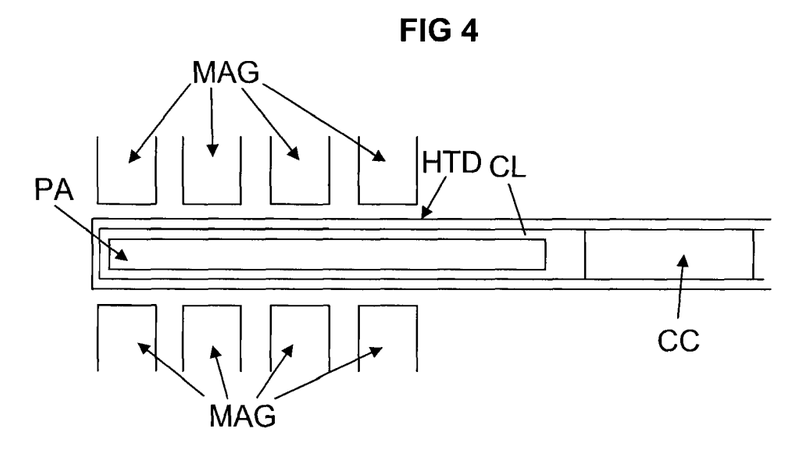
FIG. 4 depicts schematically a cooling system according to a further embodiment of the invention.

FIG. 4 depicts a part PA of a lithographic apparatus, e.g. the lithographic apparatus of FIG. 1. In an embodiment, the part is a coil of an actuator system similar to the embodiment of FIG. 2. The part PA may be surrounded by other parts, such as permanent magnets MAG that are able to cooperate with the part PA. Due to the other parts, i.e. the magnets MAG, the available space around the part PA is limited.

Arranged in a loop around the part PA is a heat transporter device HTD that is in thermal contact with the part PA via a contact layer CL which may be an adhesive or thermal grease to increase the heat transfer from the part PA to the heat transporter HTD. The heat transporter device has two free ends extending from the part PA on the same side of the part. Between the two free ends a cooling channel CC is provided that contains a coolant and has an inlet and outlet. A coolant transporter device (not shown) is provided to transport coolant from inlet to outlet through the cooling channel and possibly to remove heat from the coolant. Removal of the heat may be done by a heat exchanger that is integrated into the coolant transporter device or provided separate from the coolant transporter device.

The cooling channel is also in thermal contact with the heat transporter device HTD so that heat from the part PA can be transferred from the part to the coolant in the cooling channel via the heat transporter device. Due to the fact that the cooling channel is provided at a distance from the part PA where there is more space available, the cooling channel is able to more efficiently transport heat away from the part PA. This may be caused by allowing a turbulent flow inside the cooling channel instead of a laminar flow when less space is available.

In an embodiment, the heat transporter device is a solid cooling plate having a high heat transfer coefficient to efficiently transport the heat from the part PA to the cooling channel CC. Preferably, in an embodiment, the solid cooling plate comprises one or more of the following materials: aluminum, copper, CVD diamond, pyrolitic carbon, silver, silicium carbide, silver diamond, aluminum diamond, copper diamond.

In another embodiment the heat transporter device is a two-phase heat transporter device, in which heat is extracted from the part PA by evaporation of a working fluid which is then subsequently transported to the cooling channel to release the heat to the coolant in cooling channel by condensing. After condensation, the working fluid returns to the part PA. Preferably, the two-phase heat transporter device is configured to circulate the working fluid between part and cooling channel by means of capillary forces and vapor pressure so that no active working fluid transporter device is required. These types of heat transporter devices are commonly referred to as heat pipes. Heat pipes are available in different types, e.g. conventional heat pipes using a wick material and pulsating heat pipes. Both mentioned types are suitable to be used as heat transporter device as will also be explained below.

The distance between the part and cooling channel can vary from 1 mm to 250 mm or more. The working fluid preferably comprises one or more of the following materials: NH3, R41, $N_2O$, $CO_2$, ethane, R32, propylene, propane, DME, R22[6], R134a, 2-butene, water, methanol, acetone, ethanol.

Figure 5:
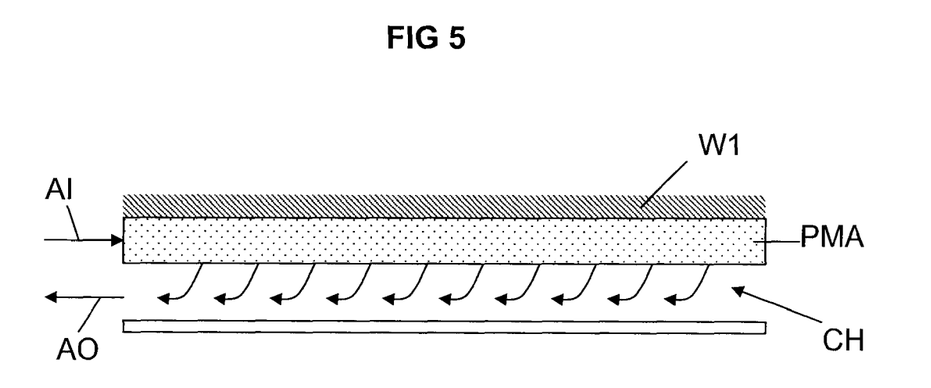
FIG. 5 depicts schematically a portion of a heat transporter device suitable to be used in the embodiment of FIG. 4.

A heat pipe using wick material is schematically shown in more detail in FIG. 5, comprising a wall W1 adjacent a part to be cooled. In turn a porous material, mesh wire or structure containing narrow grooves, i.e. a wick material PMA, is provided adjacent the wall W1. The porous material, mesh wire or structure comprises a working fluid in the liquid phase. Heat is extracted from the part to be cooled by evaporation of the working liquid. The resulting vapor will then enter a chamber CH as indicated by the curved arrows and be replaced by fresh working liquid as indicated by arrow AI. The vapor will, due to vapor pressure, be transported to a colder region, e.g. near a cooling channel, as indicated by arrow AO. There, the vapor will condense to a liquid again, be absorbed by the porous material, mesh wire or structure, and return to the part to be cooled by capillary forces. Preferably, the working fluid is optimized for a high heat transfer. Optimization may also be done by adjusting the working pressure with working temperature and environmental pressure. As a result, the walls of the chamber may be made as thin as possible to minimize the heat losses and mass.

As an example, the conditions at the cold side, i.e. the left side of the heat pipe of FIG. 5, are a temperature of 18 degrees Celsius and a vapor pressure of 15 mbar. Due to heating the temperature at the hot side, i.e. the right side of the heat pipe of FIG. 5 may have raised to 22 degrees Celsius and the vapor pressure may accordingly have raised to 25 mbar. This difference in vapor pressure is the driving force behind the transportation of vapor from the hot side to the cold side. As described, the driving force behind the transportation of liquid from the cold side to the hot side are the capillary forces in the wick material PMA.

Figure 6:
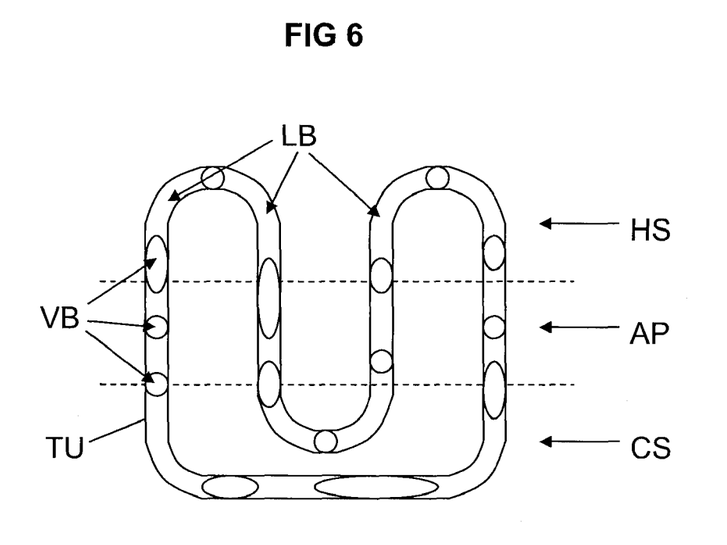
FIG. 6 depicts schematically a pulsating heat pipe that is suitable to be used as heat transporter device in the embodiment of FIG. 4.

FIG. 6 depicts a schematic view of a pulsating heat pipe that can be used as heat transporter device HTD in FIG. 4. The pulsating heat pipe comprises a tube TU, in this case forming a closed loop, but alternatively the tube may also form an open loop circuit. The tube TU is filled with a mix of liquid slugs LB and vapor bubbles VB, such that a two-phase system is created. Only a few liquid slugs LB and vapor bubbles VB are indicated with respective reference numerals.

The pulsating heat pipe has a hot side HS that is arranged in contact with a part to be cooled where it is able to extract heat by evaporation of liquid portions in the tube TU. This will result in an increase in pressure thereby pushing liquid and vapor towards a cold side CS where heat can be extracted from the medium in the pulsating heat pipe by for instance another cooling device. This will result in condensation of vapor and a decrease in pressure so that the liquid and vapor portions are able to flow back to the hot side, thereby obtaining an oscillating motion. Between the cold side CS and the hot side HS an adiabatic portion AP may be provided where preferably no exchange of heat takes place between medium and surroundings.

Due to the meandering structure of the pulsating heat pipe tube TU, the pulsating heat pipe is suitable to be wrapped around parts to be cooled and thereby being provided between the part to be cooled and e.g. the cooling channel CC of FIG. 4. It is to be noted that the number of meanders can be varied if desired.

Figure 7:
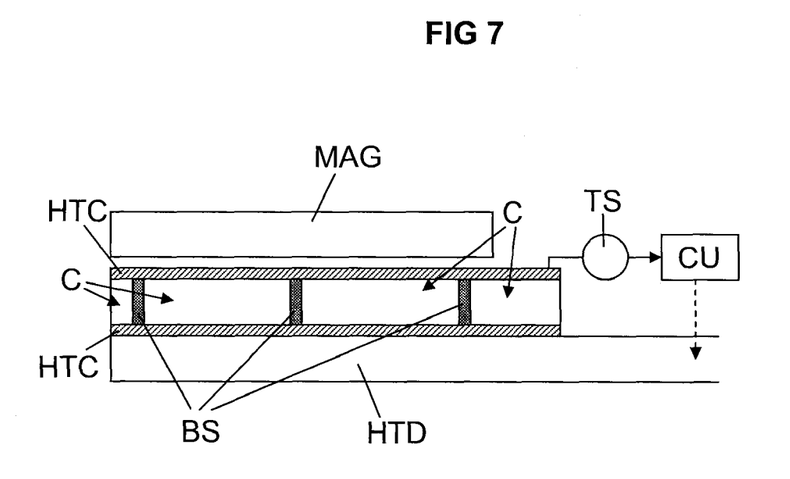
FIG. 7 depicts schematically a cooling system according to another embodiment of the invention.

FIG. 7 depicts one or more coils C cooperating with a magnet assembly MAG. In this embodiment, the magnets are only provided on one side of the coils C, so that only on one side there may be problem with the available space. To efficiently cool the coils C using minimal space between the coils C and the magnets MAG, a cooling system is provided in which the coils are sandwiched between high thermal coefficient plates HTC which are able to efficiently transport heat away from the coils. Extending between the two plates HTC are bridging structures BS that allow heat transport from the upper plate HTC facing the magnets MAG to the lower plate HTC facing away from the magnets MAG. The bridging structures BS are preferably in an embodiment made of the same high thermal coefficient material as the plates HTC.

The lower plate HTC is in thermal contact with a heat transporter device HTD able to remove heat from the lower plate HTC. The heat transporter device HTD may be a heat pipe, e.g. according to FIG. 5 or 6, which in turn may be cooled by a cooling channel containing coolant that is circulated by a coolant transporter device. The cooling system may be controlled by a control unit CU which receives temperature information from the upper plate HTC from a temperature sensor TS. The control unit CU is configured to set a temperature or heat transfer capacity of the heat transporter device based on the output of the temperature sensor TS. If for instance the desired temperature of the upper plate HTC is 22 degrees Celsius, the temperature of the medium entering the heat transporter device may be set around 17 degrees Celsius by the control unit, such that a large enough temperature difference is created between upper plate and heat transporter device to set the heat transfer rate at a value that results in a temperature of 22 degrees Celsius of the upper plate.

Although the above embodiments are shown with planar actuator systems, it will be apparent for a skilled person that the same principle can be applied to rotary actuator systems as well. These applications thus fall under the scope of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    an illumination system configured to condition a radiation beam;
    a support constructed to support a patterning device, the patterning device being capable of imparting the radiation beam with a pattern in its cross-section to form a patterned radiation beam;
    a substrate table constructed to hold a substrate;
    a projection system configured to project the patterned radiation beam onto a target portion of the substrate; and
    a cooling system configured to cool a part of the lithographic apparatus, said cooling system comprising:
        a cooling channel configured to contain coolant, said cooling channel being at least partially in thermal contact with said part, said cooling channel having an inlet and an outlet;
        a coolant transporter configured to transport coolant from the inlet through the cooling channel to the outlet; and
        a heat transporter in thermal contact with both the inlet and outlet of the cooling channel to transfer heat from the coolant present at the inlet to the coolant present at the outlet.

2. A lithographic apparatus according to claim 1, wherein the heat transporter is a thermoelectric or thermionic heat pump.

3. A lithographic apparatus according to claim 1, wherein the cooling channel is arranged in a loop around said part so that the inlet and outlet of the cooling channel are provided on the same side of said part, and wherein the heat transporter is arranged next to said part, such that said part and the heat transporter are sandwiched between two portions of the cooling channel.

4. A lithographic apparatus according to claim 1, wherein the cooling channel has an outer wall portion facing other parts of said lithographic apparatus, and wherein the cooling system comprises a temperature sensor configured to measure the temperature of said outer wall portion.

5. A lithographic apparatus according to claim 4, wherein the cooling system comprises a controller configured to drive the heat transporter based on an output of the temperature sensor.

6. A lithographic apparatus according to claim 1, wherein said part of the lithographic apparatus is part of an actuator positioning the support or substrate table.

7. A lithographic apparatus according to claim 6, wherein said part is a coil.

* * * * *

UNITED STATES PATENT AND TRADEMARK OFFICE
CERTIFICATE OF CORRECTION

PATENT NO. : 8,976,333 B2  
APPLICATION NO. : 13/115309  
DATED : March 10, 2015  
INVENTOR(S) : Sjoerd Nicolaas Lambertus Donders It is certified that error appears in the above-identified patent and that said Letters Patent is hereby corrected as shown below:

On title page, item (56) References Cited - Foreign Patent Documents, Line 1
replace "CN 1760739 5/2006"
with --CN 1766739 5/2006--.

Signed and Sealed this
Tenth Day of November, 2015

Michelle K. Lee
*Director of the United States Patent and Trademark Office*